(12) United States Patent
Lee et al.

(10) Patent No.: US 11,450,837 B2
(45) Date of Patent: Sep. 20, 2022

(54) DISPLAY DEVICE

(71) Applicant: SAMSUNG DISPLAY CO., LTD., Yongin-si (KR)

(72) Inventors: Ungsoo Lee, Yongin-si (KR); Seungwook Kwon, Yongin-si (KR); Kibeom Lee, Yongin-si (KR); Sooyoun Kim, Yongin-si (KR); Wooyong Sung, Yongin-si (KR); Seoyeon Lee, Yongin-si (KR); Hyoungsub Lee, Yongin-si (KR); Moonwon Chang, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 165 days.

(21) Appl. No.: 16/909,196

(22) Filed: Jun. 23, 2020

(65) Prior Publication Data

US 2021/0091343 A1   Mar. 25, 2021

(30) Foreign Application Priority Data

Sep. 23, 2019   (KR) .......................... 10-2019-0116878

(51) Int. Cl.
*H01L 51/00* (2006.01)
*H01L 51/52* (2006.01)
*H01L 27/32* (2006.01)

(52) U.S. Cl.
CPC ...... *H01L 51/5284* (2013.01); *H01L 27/3225* (2013.01); *H01L 51/5246* (2013.01); *H01L 51/5253* (2013.01)

(58) Field of Classification Search
CPC ............. H01L 51/5284; H01L 27/3225; H01L 51/5246; H01L 51/5253
See application file for complete search history.

(56) References Cited

U.S. PATENT DOCUMENTS

| 9,812,659 | B2 | 11/2017 | Kwon et al. |
| 10,227,498 | B2 | 3/2019 | Park et al. |
| 2018/0341290 | A1* | 11/2018 | Sim .......................... G06F 3/042 |
| 2019/0053377 | A1 | 2/2019 | Lee et al. |
| 2019/0087630 | A1 | 3/2019 | Seo et al. |

FOREIGN PATENT DOCUMENTS

| KR | 1020140108826 A | 9/2014 |
| KR | 101818306 B1 | 1/2018 |
| KR | 101841583 B1 | 3/2018 |
| KR | 1020180130151 A | 12/2018 |
| KR | 1020190016630 A | 2/2019 |
| KR | 1020190030907 A | 3/2019 |

* cited by examiner

*Primary Examiner* — Victor A Mandala
*Assistant Examiner* — Colleen E Snow
(74) *Attorney, Agent, or Firm* — Cantor Colburn LLP

(57) ABSTRACT

A display device includes: a substrate including a display area, a first non-display area, a second non-display area, and a bending area; a display element disposed on a surface of the substrate; a resin layer disposed on another surface of the substrate to correspond to the display area, where the resin layer exposes at least a portion of the another surface; an external light-absorbing layer disposed on the another surface exposed by the resin layer; and a first protective layer disposed on the another surface of the substrate to correspond to the first non-display area.

20 Claims, 10 Drawing Sheets

DISPLAY DEVICE

This application claims priority to Korean Patent Application No. 10-2019-0116878, filed on Sep. 23, 2019, and all the benefits accruing therefrom under 35 U.S.C. § 119, the content of which in its entirety is herein incorporated by reference.

BACKGROUND

1. Field

One or more embodiments relate to a display device, and more particularly, to a display device with improved product reliability.

2. Description of Related Art

Since, among display devices, organic light-emitting display devices not only have wide viewing angles and excellent contrast but also fast response speeds, organic light-emitting display devices are attracting attention as next-generation display devices.

Generally, an organic light-emitting display device includes a thin film transistor and organic light-emitting diodes on a substrate, and the organic light-emitting diodes operate by spontaneously emitting light. Such an organic light-emitting display device is used as a display unit in portable products such as mobile phones and also used as a display unit in large-scale products such as televisions.

SUMMARY

A display device, such as an organic light-emitting display device, typically includes a display unit located on a substrate. Visibility at various angles may be improved or the area of a non-display area may be reduced by bending at least a portion of the display device. However, in a conventional display device having a structure in which a transparent film is under the substrate, a sensor module may be viewed due to external light reflection.

One or more embodiments include a display device with improved product reliability by preventing a sensor module from being viewed from outside.

According to an embodiment of the invention, a display device includes: a substrate including a display area, a first non-display area, a second non-display area, and a bending area, where the first non-display area neighbors the display area, and the bending area is disposed between the first non-display area and the second non-display area; a display element disposed on a surface of the substrate to correspond to the display area, a resin layer disposed on another surface of the substrate to correspond to the display area, where the resin layer exposes at least a portion of the another surface, and the another surface is opposite the surface; an external light-absorbing layer disposed on the another surface exposed by the resin layer; and a first protective layer disposed on the another surface of the substrate to correspond to the first non-display area.

In an embodiment, the resin layer may have a first transmittance, and the external light-absorbing layer may have a second transmittance less than the first transmittance.

In an embodiment, the first transmittance may be in a range of about 50% to about 99%, and the second transmittance may be in a range of about 3% to about 30%.

In an embodiment, the display device may further include an embossed layer disposed on the another surface of the substrate with the resin layer therebetween, and an impact-alleviating layer disposed on the another surface of the substrate with the embossed layer therebetween.

In an embodiment, a first opening corresponding to the external light-absorbing layer may be defined through the embossed layer, and a second opening corresponding to the external light-absorbing layer may be defined through the impact-alleviating layer.

In an embodiment, the display device may further include a sensor module disposed on the another surface of the substrate with the external light-absorbing layer therebetween, where the sensor module is disposed to the external light-absorbing layer, and a first adhesive layer disposed between the external light-absorbing layer and the sensor module.

In an embodiment, the sensor module may be disposed on the another surface of the substrate to correspond to the first opening and the second opening.

In an embodiment, the display device may further include a metal pattern disposed on the surface of the substrate to correspond to the first non-display area, where the metal pattern allows the sensor module to be disposed at a location corresponding to the first opening and the second opening.

In an embodiment, a composition of the external light-absorbing layer may include about 5 weight percent (wt %) to about 10 wt % of a binder polymer, about 1 wt % to about 3 wt % of a photoinitiator, about 1 wt % to about 5 wt % of a carbon black, about 1 wt % to about 5 wt % of a pigment dispersion agent, about 0.01 wt % to about 1 wt % of an adder, and about 70 wt % to about 85 wt % of a solvent.

In an embodiment, the binder polymer may have an average molecular weight in a range of about 3000 to about 10000, and may be manufactured by radical-polymerizing a monomer.

In an embodiment, the composition of the external light-absorbing layer may further include about 5 wt % to about 10 wt % of a heat initiator, the heat initiator including 2,4-dimethylvaleronitrile (2,2-Azobis).

In an embodiment, the photoinitiator may include at least one material selected from Irgacure 819 (trade name, Ciba co., Switzerland, phenyl bis(2,4,6-trimethyl benzoyl) phosphine oxide), Darocur TPO (trade name, Ciba co., Switzerland, diphenyl (2,4,6-trimethylbenzoyl) phosphine oxide), Darocur 1173 (trade name, Ciba co., Switzerland, 2-Hydroxy-2-methyl-1-phenyl-1-propanone), and Irgacure 784 (trade name, Ciba co., Switzerland, Bis(eta 5-2,4-cyclopentadien-1-yl) Bis(2,6-difluoro-3-(1H-pyrrol-1-yl)-phenyl) titanium).

In an embodiment, the pigment dispersion agent may include at least one material selected from BYK-200 (trade name, BYK-chemie co., Germany), BYK-2001, BYK-161, BYK-163, BYK-160, PD-7000 (trade name, CRODA co., Germany), DFKA-4330 (trade name, BASF co., Germany), and Disper-650 (trade name, Evonik co., Germany).

In an embodiment, the solvent may include at least one material selected from propylene glycol monomethyl ether acetate, ethyl ethoxy propionate, cyclohexanone, dipropylene glycol monomethyl ether acetate, n-butyl acetate, isobutyl acetate, ethylene glycol monomethyl acetate, ethylene glycol n-butyl acetate, diethylene glycol dimethyl ether, and dipropylene glycol monomethyl acetate.

In an embodiment, the display device may further include a thin-film encapsulation layer disposed on the display element and including an inorganic encapsulation layer and an organic encapsulation layer, a touch unit disposed on the thin-film encapsulation layer, and a polarization plate disposed on the touch unit.

According to an embodiment of the invention, a display device includes: a substrate including a display area, a first non-display area, a second non-display area, and a bending area, where the first non-display area neighbors the display area, and the bending area is disposed between the first non-display area and the second non-display area; a display element disposed on a surface of the substrate to correspond to the display area; an external light-absorbing layer disposed on another surface of the substrate to correspond to the display area, where the another surface is opposite the surface; and a metal pattern disposed on the surface of the substrate to correspond to the first non-display area.

In an embodiment, the display device may further include a first protective layer disposed on the another surface of the substrate to correspond to the first non-display area.

In an embodiment, the first protective layer may have a first transmittance, and the external light-absorbing layer may have a second transmittance less than the third transmittance.

In an embodiment, the first transmittance may be in a range of about 50% to about 99%, and the second transmittance may be in a range of about 3% to about 30%.

In an embodiment, the display device may further include an impact-alleviating layer disposed on the another surface of the substrate with the external light-absorbing layer therebetween, where the impact-alleviating layer exposes at least a portion of the another surface, and an opening corresponding to the external light-absorbing layer is defined through the impact-alleviating layer, and a sensor module disposed on the another surface of the substrate with the external light-absorbing layer therebetween, where the sensor module is disposed to correspond to the external light-absorbing layer.

In an embodiment, the sensor module may be disposed on the another surface of the substrate to correspond to the opening.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1:
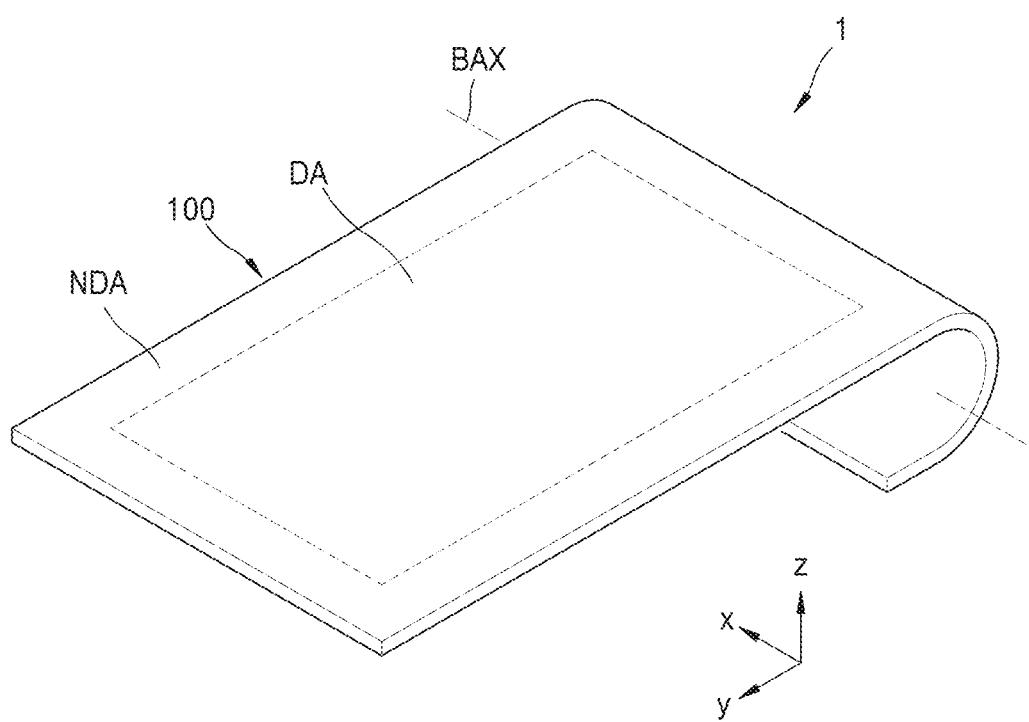
FIG. 1 is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

In embodiments, a display device is an apparatus for displaying an image and may be one of various types of display device, for example, a liquid crystal display device, an electrophoretic display device, an organic light-emitting display device, an inorganic light-emitting display device, a field emission display device, a surface-conduction electron-emitter display device, a plasma display device, and a cathode ray display device.

Hereinafter, embodiments of the invention will be described in detail with reference to the accompanying drawings. For convenience of description, embodiments where the display device is an organic light-emitting display device will be described in detail, but embodiments of a display device are not limited thereto.

FIG. 1 is a perspective view of a display device 1 according to an embodiment.

Referring to FIG. 1, in an embodiment, a display area DA on which an image is displayed, and a non-display area NDA on which an image is not displayed are defined on a substrate 100 of the display device 1. The non-display area NDA includes a bending area BA in which a portion of the non-display area NDA is bent. The remaining area except the bending area BA may be an area having a flat surface.

The bending area BA of the substrate 100 may be bent around a bending axis BAX extending in an x-direction as shown in FIG. 1.

In an embodiment, as shown in FIG. 1, the display area DA of the display device 1 may be a quadrangle, but a shape of the display area DA may be variously modified to be a circle, an ellipse, or a polygon such as a triangle or a pentagon.

The substrate 100 may include a glass or a polymer resin. The polymer resin may include a polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the polymer resin and an inorganic layer (not shown).

Figure 2:
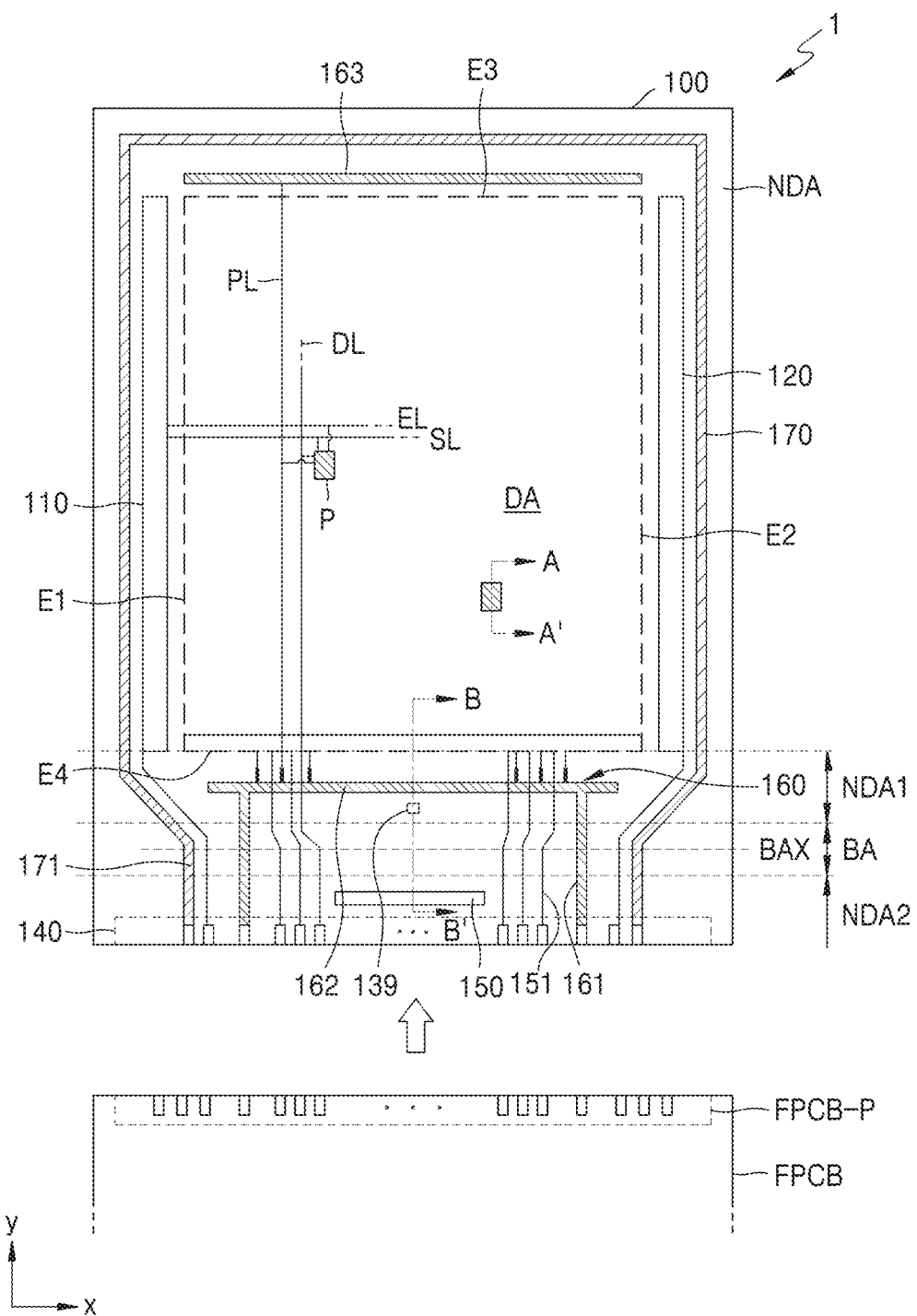
FIG. 2 is a plan view of a portion of a display device according to an embodiment.

FIG. 2 is a plan view of a portion of the display device 1 according to an embodiment.

Referring to FIG. 2, in an embodiment, the display area DA may have a shape of a rectangle or a square. In an embodiment, as shown in FIG. 2, the display area DA may include a first edge E1 and a second edge E2 facing each other, and a third edge E3 and a fourth edge E4 facing each other and each located between the first edge E1 and the second edge E2. The non-display area NDA may include a first non-display area NDA1, a second non-display area NDA2 and a bending area BA in addition to the remaining portions of the non-display area NDA surrounding the display area DA.

The first non-display area NDA1 and the second non-display area NDA2 may be defined around the bending area BA. The first non-display area NDA1 may neighbor the fourth edge E4 of the display area DA. The second non-display area NDA2 is an area that is not viewed from a front side when the bending area BA is bent. The second non-display area NDA2 includes a driving circuit 150.

Like the remaining portions of the non-display area NDA contacting the first to third edges E1, E2, and E3 of the display area DA, the first non-display area NDA1 may be the non-display area NDA that define a bezel area in a display device or an electronic apparatus such as smartphones, etc. including a display device.

In an embodiment, the display device 1 includes a plurality of pixels P arranged in the display area DA. Each of the plurality of pixels P may include a display element such as an organic light-emitting diode OLED. Each pixel P may emit, for example, red, green, blue, or white light from an organic light-emitting diode OLED. In an embodiment, a pixel P may be a pixel that emits red, green, blue, or white light as described above. The display area DA may be protected from external air or moisture by being covered by a thin-film encapsulation layer TFE (see FIG. 4).

Each pixel P may be electrically connected to outer circuits arranged in the non-display area NDA. A first scan driving circuit 110, a second scan driving circuit 120, the driving circuit 150, and a second power supply line 170 may be arranged in the non-display area NDA. The second power supply line 170 may extend in a y-direction and be arranged in the first non-display area NDA1, the bending area BA, and the second non-display area NDA2. A first power supply line 160 and a metal pattern 139 may be arranged in the first non-display area NDA1, and a pad unit 140 and the driving circuit 150 may be arranged in the second non-display area NDA2.

The first scan driving circuit 110 may provide a scan signal to each pixel P through a scan line SL. The first scan driving circuit 110 may provide an emission control signal to each pixel through an emission control line EL. The second scan driving circuit 120 may be arranged in parallel to the first scan driving circuit 110 with the display area DA therebetween. Some of the pixels P arranged in the display area DA may be electrically connected to the first scan driving circuit 110, and the rest of the pixels P may be connected to the second scan driving circuit 120. In an alternative embodiment, the second scan driving circuit 120 may be omitted.

The pad unit 140 may be arranged on one side of the substrate 100. The pad unit 140 may be exposed by not being covered by an insulating layer and electrically connected to a flexible printed circuit board FPCB. A pad unit FPCB-P of the flexible printed circuit board FPCB may be electrically connected to the pad unit 140 of the display device 1. The flexible printed circuit board FPCB transfers a signal of a controller (not shown) or a power voltage to the display device 1.

Control signals generated by the controller may be respectively transferred to the first and second scan driving circuits 110 and 120 through the flexible printed circuit board FPCB. The controller may respectively provide a first power voltage ELVDD and a second power voltage ELVSS (see FIG. 3) to the first and second power supply lines 160 and 170 through first and second connection lines 161 and 171. The first power voltage ELVDD may be provided to each pixel P through a driving voltage line PL connected to the first power supply line 160, and the second power voltage ELVSS may be provided to an opposite electrode of each pixel P connected to the second power supply line 170.

The driving circuit 150 may be electrically connected to the data line DL. The driving circuit 150 may provide a driving signal to each pixel P through a connection line 151 and the data line DL, the connection line 151 being connected to the pad unit 140, and the data line DL being connected to the connection line 151. In an embodiment, as shown in FIG. 2 that the driving circuit 150 is arranged between the first power supply line 160 and the pad unit 140, but not being limited thereto. Alternatively, the driving circuit 150 may be arranged on the flexible printed circuit board FPCB.

The first power supply line 160 may include a first sub-line 162 and a second sub-line 163 that are parallel to each other with the display area DA therebetween and extending in an x-direction. The second power supply line 170 may have a loop shape having one open side and partially surround the display area DA.

Figure 3:
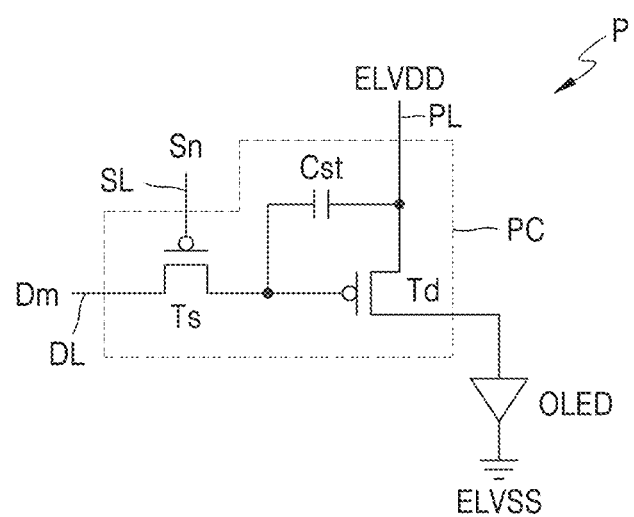
FIG. 3 is an equivalent circuit diagram of a pixel included in a display device according to an embodiment.

FIG. 3 is an equivalent circuit diagram of a pixel included in the display device 1 according to an embodiment.

Referring to FIG. 3, in an embodiment, a pixel circuit PC may include a driving thin film transistor Td, a switching thin film transistor Ts, and a storage capacitor Cst. The switching thin film transistor Ts is connected to the scan line SL and the data line DL and may be configured to transfer a data signal Dm input through the data line DL to the driving thin film transistor Td, in response to a scan signal Sn input through the scan line SL.

The storage capacitor Cst is connected to the switching thin film transistor Ts and the driving voltage line PL and may be configured to store a voltage corresponding to a voltage difference between a voltage transferred from the switching thin film transistor Ts and the first power voltage ELVDD (or a driving voltage) supplied to the driving voltage line PL.

The driving thin film transistor Td is connected to the driving voltage line PL and the storage capacitor Cst and may be configured to control a driving current flowing through an organic light-emitting diode OLED from the driving voltage line PL, in response to the voltage stored in the storage capacitor Cst. The organic light-emitting diode OLED may emit light having a predetermined brightness by using the driving current.

In an embodiment, as shown in FIG. 3, the pixel circuit PC includes two thin film transistors and a single storage capacitor, but the disclosure is not limited thereto. In an alternative embodiment, the pixel circuit PC may include seven thin film transistors and one storage capacitor.

Figure 4:
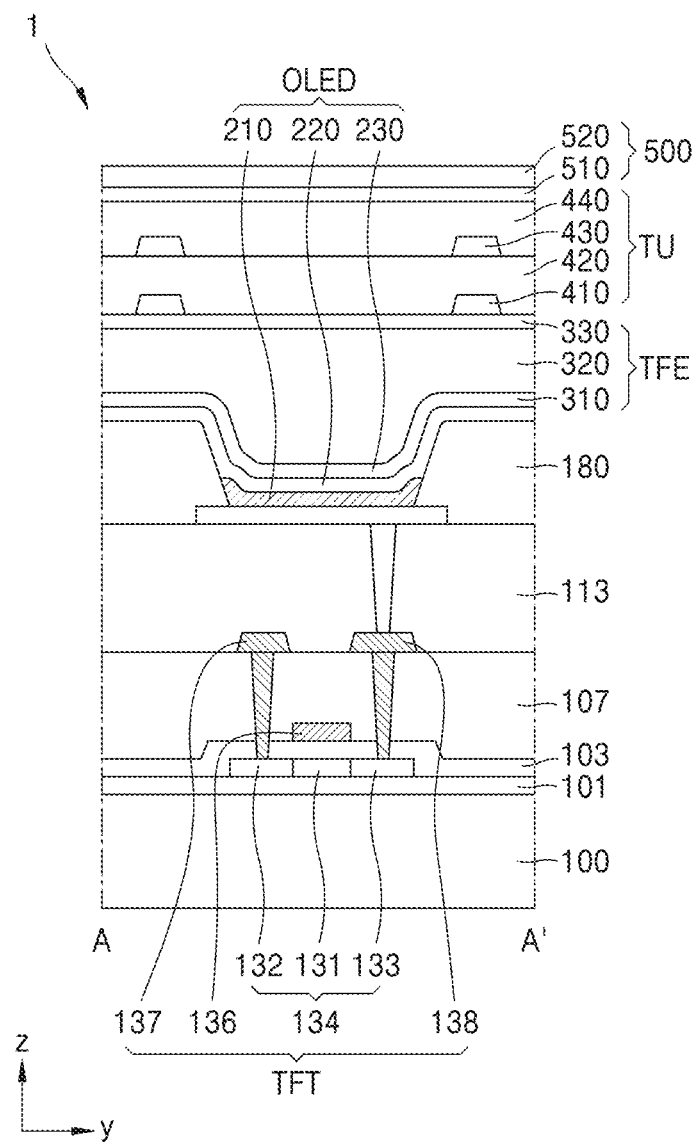
FIG. 4 is a cross-sectional view of a portion of the display device taken along line A-A' of FIG. 2.

FIG. 4 is a cross-sectional view of a portion of the display device taken along line A-A' of FIG. 2. Particularly, FIG. 4 is a view showing a stacking structure arranged on a surface of the substrate 100 corresponding to the display area DA according to an embodiment.

In an embodiment, as shown in FIG. 4, a display element, the thin-film encapsulation layer TFE, a touch unit TU, and a polarization plate 500 may be arranged on one surface of the substrate 100 corresponding to the display area DA. In an embodiment, the display element includes the organic light-emitting diode OLED.

The substrate 100 may include a glass or a polymer resin. The polymer resin may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the above polymer resin and an inorganic layer (not shown).

The buffer layer 101 is disposed on the substrate 100, may reduce or block the penetration of foreign substances, moisture, or external air from below the substrate 100, and provide a flat surface on the substrate 100. The buffer layer 101 may include an inorganic material such as an oxide or a nitride, an organic material, or an organic/inorganic composite material and include a single layer or a multi-layer including an inorganic material and an organic material. A barrier layer (not shown) for blocking the penetration of external air may be further arranged between the substrate 100 and the buffer layer 101.

The thin film transistor TFT, the storage capacitor Cst, and the organic light-emitting diode OLED may be disposed or arranged over the substrate 100. In such an embodiment, the thin film transistor TFT may be provided at a location corresponding to the display area DA, and the organic light-emitting diode OLED may be electrically connected to the thin film transistor TFT and the storage capacitor Cst.

The thin film transistor TFT may include a semiconductor layer 134 and a gate electrode 136. The semiconductor layer 134 may include, for example, a polycrystalline silicon. The semiconductor layer 134 may include a channel region 131, a source region 132 and a drain region 133. In an embodiment, the channel region 131 overlaps the gate electrode 136, and the source region 132 and the drain region 133 are respectively arranged on two opposite sides of the channel region 131 and include impurities having a concentration higher than that of the channel region 131. In such an embodiment, the impurities may include N-type impurities or P-type impurities. The source region 132 and the drain region 133 may respectively correspond to a source electrode and a drain electrode of the thin film transistor TFT.

The semiconductor layer 134 may include an oxide semiconductor and/or a silicon semiconductor. In an embodiment where the semiconductor layer 134 includes an oxide semiconductor, the semiconductor layer 134 may include, for example, an oxide of at least one material selected from indium (In), gallium (Ga), stannum (Sn), zirconium (Zr), vanadium (V), hafnium (Hf), cadmium (Cd), germanium (Ge), chrome (Cr), titanium (Ti), and zinc (Zn). In one embodiment, for example, the semiconductor layer 134 may include InSnZnO ("ITZO") or InGaZnO ("IGZO"). In an embodiment where the semiconductor layer 134 includes a silicon semiconductor, the semiconductor layer 134 may include, for example, amorphous silicon ("a-Si") or low temperature polycrystalline silicon ("LTPS") in which a-Si is crystallized.

The gate electrode 136 may have a single layer structure or a multi-layer structure including a layer of at least one metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line for applying an electric signal to the gate electrode 136.

A gate insulating layer 103 may be disposed or arranged between the semiconductor layer 134 and the gate electrode 136. The gate insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The gate insulating layer 103 may have a single layer structure or a multi-layer structure including a layer of at least one inorganic insulating material selected from the above inorganic insulating materials.

An interlayer insulating layer 107 may be disposed or arranged on the gate electrode 136. The interlayer insulating layer 107 may include at least one material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) and zinc oxide ($ZnO_2$), and may have a single layer structure or a multi-layer structure.

The thin film transistor TFT may include a source electrode 137 and a drain electrode 138 respectively connected to the source region 132 and the drain region 133 of the semiconductor layer 134. The source electrode 137 and the drain electrode 138 are respectively and electrically connected to the source region 132 and the drain region 133 of the semiconductor layer 134 through contact holes defined through the gate insulating layer 103 and the interlayer insulating layer 107.

The source electrode 137 and the drain electrode 138 may include at least one material selected from aluminum (Al), copper (Cu) and titanium (Ti), and have a single layer structure or a multi-layer structure. In an embodiment, each of the source electrode 137 and the drain electrode 138 may include a stacked structure of Ti/Al/Ti or TiN/Al/Ti, for example.

In an embodiment, the data line DL (see FIG. 3) and the driving voltage line PL (see FIG. 3) may include a same material as those of the source electrode 137 and the drain electrode 138, and may be disposed or arranged in a same layer as a layer in which the source electrode 137 and the drain electrode 138 are disposed or arranged.

The thin film transistor TFT may be covered by a protective layer (not shown). The protective layer may prevent a wiring from being exposed to an etching environment, where the wiring includes a metal such as aluminum that may be damaged by etchant during a process of manufacturing the display device.

A planarization layer 113 may be disposed or arranged on the interlayer insulating layer 107. The planarization layer 113 may provide a planarized top surface on the pixel circuit PC, on which the organic light-emitting diode OLED is to be disposed.

The planarization layer 113 may include a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The planarization layer 113 may include an inorganic material. The planarization layer 113 may include at least one material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). In an embodiment where the planarization layer 113 include an inorganic material, chemical planarization polishing may be selectively performed. In an embodiment, the planarization layer 113 may include both an organic material and an inorganic material.

A pixel electrode 210 may be disposed or arranged on the planarization layer 113. The pixel electrode 210 may include a (semi) transparent electrode or a reflective electrode. In an embodiment, the pixel electrode 210 may include a reflective layer and a transparent or semi-transparent electrode layer on the reflective layer. In such an embodiment, the reflective layer includes at least one material selected from silver (Ag), magnesium (Mg), aluminum (Al), platinum (Pt), palladium (Pd), gold (Au), nickel (Ni), neodymium (Nd), iridium (Ir), chrome (Cr), and a combination (e.g., a compound) thereof. The transparent or semi-transparent electrode layer may include at least one material selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, the pixel electrode 210 may have a stacked structure of ITO/Ag/ITO, for example.

A pixel-defining layer 180 may be disposed or arranged on the planarization layer 113. The pixel-defining layer 180 may define an emission area of a pixel by including an opening exposing a central portion of the pixel electrode 210. In such an embodiment, the pixel-defining layer 180 may prevent an arc, etc. from occurring at edges of the pixel electrode 210 by increasing a distance between the edges of the pixel electrode 210 and the opposite electrode 230 over the pixel electrode 210. The pixel-defining layer 180 may include an organic insulating material such as polyimide, polyamide, an acrylic resin, BCB, HMDSO, and a phenolic resin. The pixel-defining layer 180 may be formed by a method such as a spin coating.

A spacer (not shown) may be disposed or arranged on the pixel-defining layer 180. The spacer may prevent the organic light-emitting diode OLED from being damaged by sagging of a mask during a manufacturing process that uses the mask. The spacer may have a single layer structure or a multi-layer structure including a layer of an organic insulating material such as polyimide, polyamide, an acrylic resin, BCB, HMDSO, and a phenolic resin. The spacer may be formed by a method such as spin coating.

An intermediate layer 220 may be disposed or arranged on a portion of the pixel electrode 210 that is exposed by the pixel-defining layer 180. The intermediate layer 220 may include an emission layer, and may further include functional layers under and on the emission layer, the functional layers including a hole transport layer ("HTL"), a hole injection layer ("HIL"), an electron transport layer ("ETL"), and an electron injection layer ("EIL").

The emission layer may include an organic material including a fluorescent or phosphorous material emitting red, green, blue, or white light. The emission layer may include a low molecular weight organic material or a polymer organic material.

In an embodiment where the emission layer includes a low molecular weight material, the intermediate layer 220 may have a structure in which an HIL, an HTL, an emission layer ("EML"), an ETL, an EIL, etc. are stacked in a single or a composite configuration. The intermediate layer 220 may include a low molecular weight material or at least one selected from various organic materials such as copper phthalocyanine ("CuPc"), N, N'-Di (naphthalene-1-yl)-N, N'-diphenyl-benzidine ("NPB"), and tris-8-hydroxyquinoline aluminum ("Alq3"). Such layers may be formed by a vacuum deposition.

In an embodiment where the emission layer includes a polymer material, the intermediate layer 220 may have a structure generally including an HTL and an EML. In such an embodiment, the HTL may include poly (3,4-ethylene-dioxythiophene) ("PEDOT"), and the EML may include a polymer material such as a polyphenylene vinylene ("PPV")-based material and a polyfluorene-based material. The emission layer may be formed by a screen printing, an inkjet printing or a laser induced thermal imaging ("LITI"), for example.

The pixel electrode 210 may be provided in plural, and the intermediate layer 220 may be arranged to correspond to each of the plurality of pixel electrodes 210. However, embodiments are not limited thereto. Alternatively, the intermediate layer 220 may include a layer integrally formed as a single unitary body over the plurality of pixel electrodes 210. In embodiment, the intermediate layer 220 may be variously modified. In an alternative embodiment, the intermediate layer 220 may be patterned or arranged to correspond to each of the plurality of pixel electrodes 210, and the functional layer(s) except for the intermediate layer 220 may be integrally formed as a single unitary body over the plurality of pixel electrodes 210.

The opposite electrode 230 may be disposed or arranged on the intermediate layer 220. The opposite electrode 230 may be disposed or arranged on the intermediate layer 220 and may entirely cover the intermediate layer 220.

The opposite electrode 230 may be disposed or arranged in the display area DA and arranged on an entire surface of the display area DA. In such an embodiment, the opposite electrode 230 may be integrally formed as a single unitary body to cover the plurality of pixels.

The opposite electrode 230 may include a transparent electrode or a reflective electrode. In an embodiment, the opposite electrode 230 may be a transparent or semi-transparent electrode, and may include a metal thin layer having a small work function and including at least one selected from lithium (Li), calcium (Ca), lithium fluoride (LiF)/Ca, LiF/aluminum (Al), Al, silver (Ag), magnesium (Mg), and a combination thereof. in an embodiment, a transparent conductive oxide ("TCO") layer may be further arranged on the metal thin layer, and the TCO layer may include ITO, IZO, ZnO, or $In_2O_3$.

In an embodiment where the pixel electrode 210 includes a reflective electrode and the opposite electrode 230 includes a transparent electrode, light emitted from the intermediate layer 220 is emitted toward the opposite electrode 230 and thus the display device 1 may be a top-emission type display device.

In an embodiment, where the pixel electrode 210 includes a transparent or semi-transparent electrode and the opposite electrode 230 includes a reflective electrode, light emitted from the intermediate layer 220 is emitted toward the substrate 100 and thus the display device 1 may be a bottom-emission type display device. However, the embodiments are not limited thereto, and alternatively, the display device 1 may be a dual-emission type display device that emits light in two directions including a top side and a bottom side (of the display device 1).

The thin-film encapsulation layer TFE may be disposed or arranged on the opposite electrode 230 to protect the organic light-emitting diode OLED from external moisture and oxygen. The thin-film encapsulation layer TFE may include an organic encapsulation layer and an inorganic encapsulation layer.

The thin-film encapsulation layer TFE may include a first inorganic encapsulation layer 310, a second inorganic encapsulation layer 330, and an organic encapsulation layer 320, the second inorganic encapsulation layer 330 may be arranged over the first inorganic encapsulation layer 310, and the organic encapsulation layer 320 may be between the first inorganic encapsulation layer 310 and the second inorganic encapsulation layer 330.

The first inorganic encapsulation layer 310 and the second inorganic encapsulation layer 330 may include at least one inorganic material selected from aluminum oxide ($Al_2O_3$), titanium oxide ($TiO_2$), tantalum oxide ($Ta_2O_5$), and hafnium oxide ($HfO_2$), and zinc oxide ($ZnO_2$), silicon oxide ($SiO_2$), silicon nitride ($SiN_x$), and silicon oxynitride (SiON). The first inorganic encapsulation layer 310 and the second inorganic encapsulation layer 330 may have a single layer structure or a multi-layer structure including a layer of at least one material selected from the above-listed materials. The first inorganic encapsulation layer 310 and the second inorganic encapsulation layer 330 may include a same material as or different materials from each other.

The organic encapsulation layer 320 may include a monomer-based material or a polymer-based material. The organic encapsulation layer 320 may include at least one material selected from polyethylene terephthalate, polyethylene naphthalate, polycarbonate, polyimide, polyethylene sulfonate, polyoxymethylene, polyacrylate, hexamethyldisiloxane, an acrylic resin (e.g. polymethylmethacrylate, polyacrylic acid, etc.) and a combination thereof.

A touch unit TU may be disposed or arranged directly on the thin-film encapsulation layer TFE. Each touch unit TU may include a first conductive layer 410, a second conductive layer 430 over the first conductive layer 410, a first insulating layer 420 between the first conductive layer 410 and the second conductive layer 430, and a second insulating layer 440 on the second conductive layer 430. The first conductive layer 410 may include first sensing electrodes, and the second conductive layer 430 may include second sensing electrodes. In an embodiment, the first conductive layer 410 and the second conductive layer 430 may have a mesh shape to prevent themselves from being viewed by a user and have a three-layered structure of titanium/aluminum/titanium.

The first conductive layer 410 and the second conductive layer 430 may have a single-layered structure or a stacked multi-layered structure. A conductive layer of a single-layered structure may include a metal layer or a transparent conductive layer. The metal layer may include molybdenum, silver, titanium, copper, aluminum, and an alloy thereof. A transparent conductive layer may include a transparent conductive oxide such as ITO, IZO, zinc oxide (ZnO), and ITZO. In an embodiment, the transparent conductive layer may include a conductive polymer such as PEDOT, a metal nano wire, graphene, etc. The stacked multi-layered structure may include a multi-layered conductive layer including multi-layered metal layers. The multi-layered metal layers may have, for example, a three-layered structure of Ti/Al/Ti. The multi-layered conductive layer may include a metal layer and a transparent conductive layer.

Each of the first insulating layer 420 and the second insulating layer 440 may have a single-layered structure or a multi-layered structure. Each of the first insulating layer 420 and the second insulating layer 440 may include at least one material selected from an inorganic material, an organic material and a composite material.

In an embodiment, at least one of the first insulating layer 420 and the second insulating layer 440 may include an inorganic layer. The inorganic layer may include at least one material selected from aluminum oxide, titanium oxide, silicon oxide, silicon oxynitride, zirconium oxide, and hafnium oxide.

In an embodiment, at least one of the first insulating layer 420 and the second insulating layer 440 may include an organic layer. The organic layer may include at least one material selected from an acrylic resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The touch unit TU may sense an external input using, for example, a capacitance method. In such an embodiment, an operation method of the touch unit TU is not particularly limited. In an embodiment, the touch unit TU may sense an external input by using an electromagnetic induction method or a pressure sensing method.

The polarization plate 500 may be disposed or arranged on the touch unit TU. The polarization plate 500 may include a polarization adhesive layer 510 and a polarization layer 520. The polarization adhesive layer 510 may attach the polarization layer 520 onto the touch unit TU. In an alternative embodiment, the polarization adhesive layer 510 may be omitted. The polarization layer 520 may cover an entire surface of the display area DA and a portion of the non-display area NDA. The polarization layer 520 may serve as a reflection prevention layer that improves a contrast ratio and visibility by reducing external light reflection. The polarization layer 520 may include a linear polarizer and a phase retarder.

Figure 5:
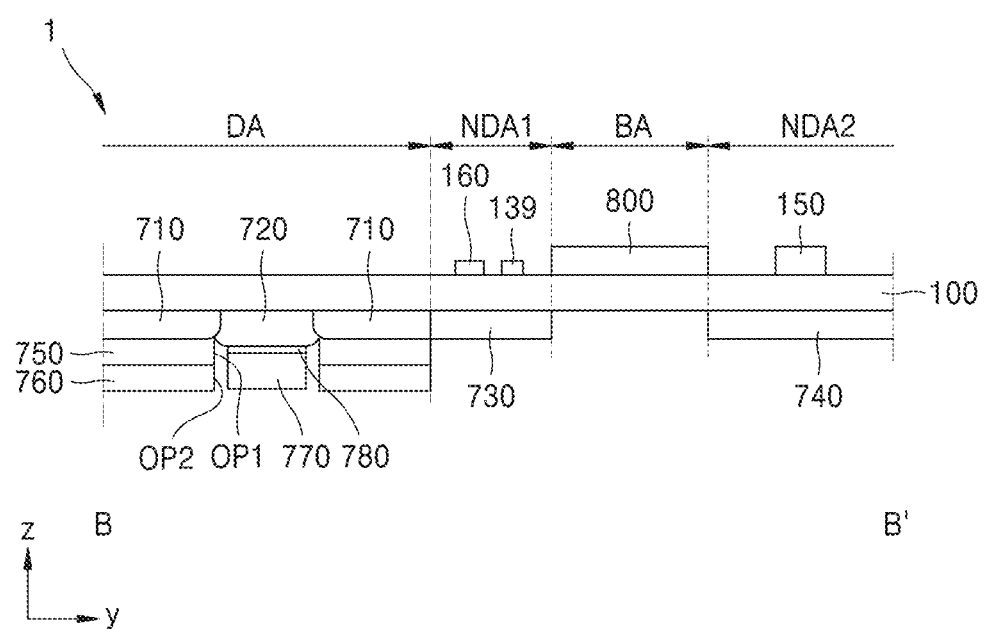
FIG. 5 is a cross-sectional view of a portion of the display device taken along line B-B' of FIG. 2.
Figure 6:
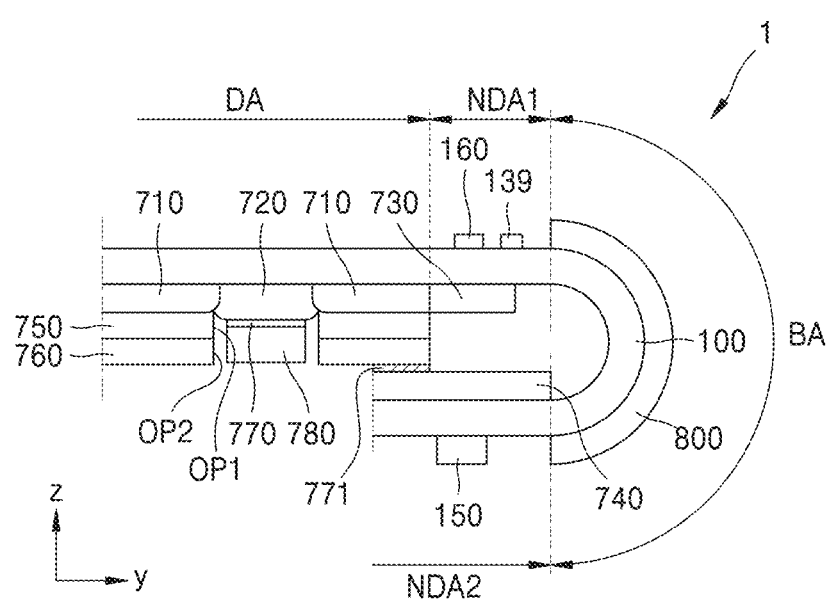
FIG. 6 is a cross-sectional view of a portion bent along a bending axis of the display device of FIG. 5.

FIG. 5 is a cross-sectional view of a portion of the display device taken along line B-B' of FIG. 2, and FIG. 6 is a cross-sectional view of a figure bent along a bending axis of the display device of FIG. 5.

In an embodiment, the thin film transistor TFT, the organic light-emitting diode OLED, the thin-film encapsulation layer TFE, the touch unit TU, and the polarization plate 500 shown in FIG. 4 may be disposed or arranged on the substrate 100 of FIGS. 5 and 6. However, for convenience of illustration and description, such elements are omitted in FIGS. 5 and 6.

Referring to FIG. 5, an embodiment of the display device includes the substrate 100, a display element, a resin layer 710, an external light-absorbing layer 720 and a first protective layer 730. In such an embodiment, the substrate 100 includes the display area DA, the first non-display area NDA1 that neighbors the display area DA, the second non-display area NDA2, and the bending area BA arranged between the first non-display area NDA1 and the second non-display area NDA2. In such an embodiment, the display element is disposed or arranged over a surface of the substrate 100 to correspond to the display area DA, the resin layer 710 is disposed or arranged on another surface of the substrate 100 opposite to the surface to correspond to the display area DA to expose at least a portion of the another surface, the external light-absorbing layer 720 is disposed or arranged on the another surface exposed by the resin layer 710, and the first protective layer 730 is disposed or arranged on the another surface of the substrate 100 to corresponding to the first non-display area NDA1.

In a conventional display device, a film having a high transmittance is coupled to the another surface of the substrate 100 by using an adhesive, and a sensor module 780 may viewed or recognized due to external light reflection.

Also, in a case where a film on which colored ink is coated is locally stuck on the another surface of the substrate 100 on which the sensor module 780 is arranged, chopping may occur due to a film step difference during a process. In a case where colored ink is entirely applied, it may be difficult to perform a process due to non-recognition of an align mark.

In an embodiment of a display device according to the invention, the sensor module 780 is effectively prevented from being viewed and a product reliability is improved, by arranging, between the sensor module 780 and the another surface of the substrate 100, the external light-absorbing layer 720 that may absorb external light with low transmittance, and arranging the resin layer 710 having a high transmittance on the another surface of the substrate 100 on which the sensor module 780 is not arranged.

The resin layer 710 may be disposed or arranged on the another surface of the substrate 100 opposite to the surface to correspond to the display area DA and may expose at least a portion of the another surface. The resin layer 710 may have a first transmittance in a range of about 50% to about 99%. The resin layer 710 may include at least one material selected from polyacrylate, an acrylic resin, polymethacrylate, polyacrylic acid, a poly urethane acrylate resin, and a combination thereof. The resin layer 710 may be provided or arranged by using an inkjet, a spin coating or a slit coating, for example.

The external light-absorbing layer 720 may be disposed or arranged on the another surface exposed by the resin layer 710. The external light-absorbing layer 720 may have a second transmittance less than the first transmittance, and the second transmittance may be in a range of about 3% to about 30%. The external light-absorbing layer 720 may be disposed or arranged between the sensor module 780 and the another surface of the substrate 100 and may absorb external light, thereby preventing the sensor module 780 from being viewed. The external light-absorbing layer 720 may be provided or arranged on the another surface of the substrate 100 that is exposed by the resin layer 710 by using an inkjet, a spin coating, a slit coating, etc.

The external light-absorbing layer 720 may include a black composition or a scattering agent. The composition of the external light-absorbing layer 720 may include a binder polymer of about 5 weight percent (wt %) to about 10 wt %, a photoinitiator of about 1 wt % to about 3 wt %, a carbon black of about 1 wt % to about 5 wt %, a pigment dispersion agent of about 1 wt % to about 5 wt %, an adder of about 0.01 wt % to about 1 wt %, and a solvent of about 70 wt % to about 85 wt %.

The binder polymer may have an average molecular weight in a range of about 3000 to about 10000, and may be manufactured by radical-polymerizing a monomer. In an embodiment, the binder polymer may include an acryl-based resin. The acryl-based resin is a polymer including two or more different copolymerization monomers and may include at least one selected from methacrylic acid, acrylic acid, crotonic acid, maleic acid, N-vinyl pyrrolidone, styrene monomer, methyl methacrylate, benzyl methacrylate, 2-hydroxyethyl methacrylate ("2-HEMA"), acrylic methacrylate, 2-hydroxyethyl methacrylate, and glycidyl methacrylate. The composition of the external light-absorbing layer 720 may further include a heat initiator of about 5 wt % to about 10 wt %, and the heat initiator may include 2,4-dimethylvaleronitrile ("2,2-Azobis").

The photoinitiator is a material that initiates a light reaction such that a material is hardened by light and may include at least one material selected from Irgacure 819 (trade name, Ciba co., Switzerland, phenyl bis(2,4,6-trimethyl benzoyl) phosphine oxide), Darocur TPO (trade name, Ciba co., Switzerland, diphenyl (2,4,6-trimethylbenzoyl) phosphine oxide), Darocur 1173 (trade name, Ciba co., Switzerland, 2-hydroxy-2-methyl-1-phenyl-1-propanone), and Irgacure 784 (trade name, Ciba co., Switzerland, Bis(eta 5-2,4-cyclopentadien-1-yl) Bis(2,6-difluoro-3-(1H-pyrrol-1-yl)-phenyl) titanium).

The pigment dispersion agent is a material that suppresses condensation between pigments by surrounding a pigment surface and may include at least one material selected from BYK-200 (trade name, BYK-chemie co., Germany), BYK-2001, BYK-161, BYK-163, BYK-160, PD-7000 (trade name, CRODA co., Germany), DFKA-4330 (trade name, BASF co., Germany), and Disper-650 (trade name, Evonik co., Germany).

The solvent is a material used for dissolving materials, and may include at least one material selected from propylene glycol monomethyl ether acetate, ethyl ethoxy propionate, cyclohexanone, dipropylene glycol monomethyl ether acetate, n-butyl acetate, isobutyl acetate, ethylene glycol monomethyl acetate, ethylene glycol n-butyl acetate, diethylene glycol dimethyl ether, and dipropylene glycol monomethyl acetate.

An embossed layer 750 may be disposed or arranged over the another surface of the substrate 100 with the resin layer 710 therebetween, and an impact-alleviating layer 760 may be disposed or arranged over the another surface of the substrate 100 with the embossed layer 750 therebetween. A first opening OP1 corresponding to the external light-absorbing layer 720 is defined through the embossed layer 750, and a second opening OP2 corresponding to the external light-absorbing layer 720 is defined through the impact-alleviating layer 760. The embossed layer 750 may reduce external light reflection, and the impact-alleviating layer 760 may alleviate an impact applied to the display device from the outside.

The sensor module 780 may be disposed or arranged over the another surface of the substrate 100 with the external light-absorbing layer 720 therebetween to correspond to the external light-absorbing layer 720. A first adhesive layer 770 may be disposed or arranged between the external light-absorbing layer 720 and the sensor module 780. The sensor module 780 may be disposed or arranged on the another surface of the substrate 100 corresponding to the first opening OP1 and the second opening OP2. In an embodiment, the sensor module 780 may include a fingerprint module, but is not limited thereto. The first adhesive layer 770 may attach the sensor module 780 onto the external light-absorbing layer 720.

The first protective layer 730 may be disposed or arranged on the another surface of the substrate 100 corresponding to the first non-display area NDA1. The first protective layer 730 may have a third transmittance greater than the second transmittance. The third transmittance may be the same as the first transmittance. The first protective layer 730 may be disposed or arranged on the another surface of the substrate 100 to protect the another surface of the substrate 100 and wirings (not shown) on the another surface of the substrate 100. In an embodiment, the first protective layer 730 may include the same material as that of the resin layer 710.

The metal pattern 139 may be disposed or arranged on the surface of the substrate 100 corresponding to the first non-display area NDA1. The metal pattern 139 may be located in the same layer as a layer in which the source electrode 137 and the drain electrode 138 are arranged to serve as an align mark such that the sensor module 780 is allowed to be arranged at a location corresponding to the first opening OP1 and the second opening OP2. The metal pattern 139 may include at least one material selected from aluminum (Al), copper (Cu), and titanium (Ti) and may include a single layer or a multi-layer. In an embodiment, the metal pattern 139 may have a multi-layered structure of Ti/Al/Ti or TiN/Al/Ti, for example. The first power supply line 160 may be disposed or arranged in the same layer as a layer in which the metal pattern 139 is arranged.

A bending protective layer 800 may be disposed or arranged on the surface of the substrate 100 corresponding to the bending area BA. Referring to FIG. 6, the bending protective layer 800 protects a portion of the substrate 100 in the bending area BA and wirings (not shown) on the substrate 100 while the bending area BA is bent around a bending axis BAX extending in the first direction (an x-direction) as shown in FIG. 1.

The driving circuit 150 may be disposed or arranged on the surface of the substrate 100 corresponding to the second non-display area NDA2. Since the driving circuit 150 may be electrically connected to the data line DL, the driving circuit 150 may provide a driving signal to each pixel P through the connection line 151 and the data line DL, where the connection line 151 may be connected to the pad unit 140, and the data line DL may be connected to the connection line 151.

A second protective layer 740 may be disposed or arranged on the another surface of the substrate 100 to correspond to the second non-display area NDA2. The second protective layer 740 may be disposed or arranged on the another surface of the substrate 100 to protect the another surface of the substrate 100 and wirings (not shown) on the another surface of the substrate 100. In an embodiment, the second protective layer 740 may include the same material as that of the first protective layer 730. Referring to FIG. 6, while the bending area BA is bent around the bending axis BAX, the second protective layer 740 may be attached onto another surface of the impact-alleviating layer 760 by a second adhesive 771.

Figure 7:
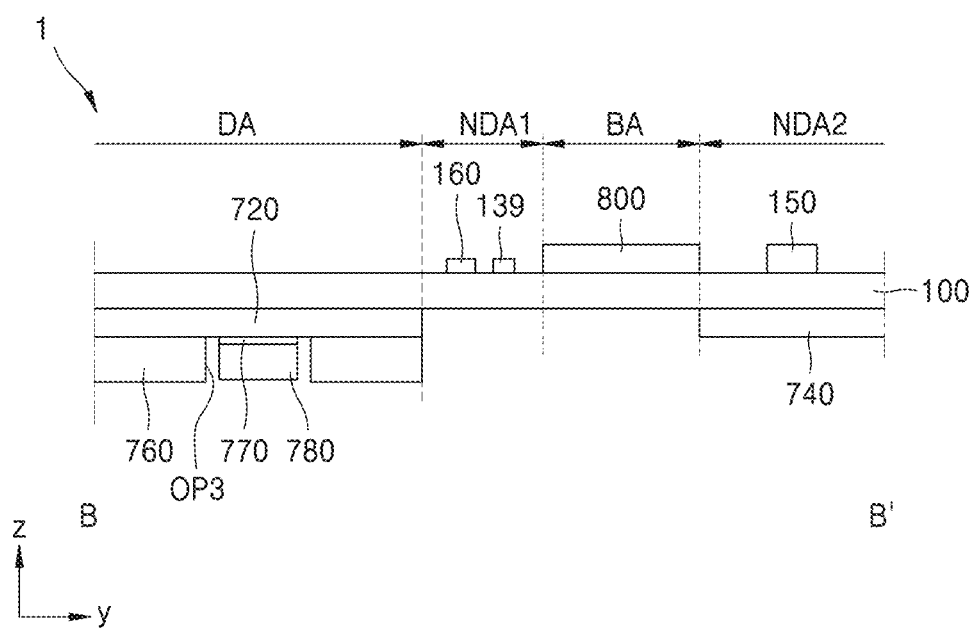
FIG. 7 is a cross-sectional view of a portion of the display device taken along line B-B' of FIG. 2.
Figure 8:
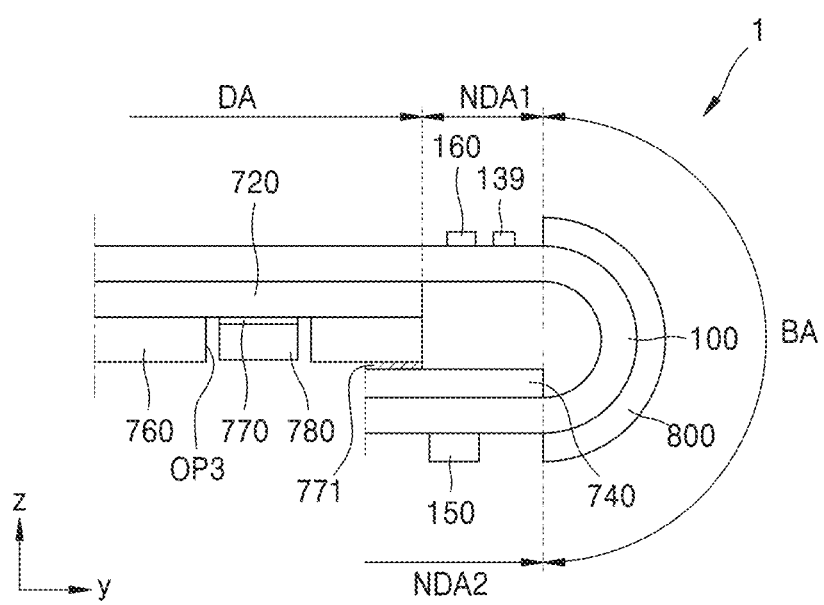
FIG. 8 is a cross-sectional view of a portion bent along a bending axis of the display device of FIG. 7.

FIG. 7 is a cross-sectional view of a portion of the display device taken along line B-B' of FIG. 2, and FIG. 8 is a cross-sectional view of a figure bent along the bending axis BAX of the display device of FIG. 7.

The display device shown in FIG. 7 is substantially the same as the display device shown in FIG. 5 except for elements on the another surface of the substrates 100 corresponding to the display area DA and elements on the another surface of the substrate 100 corresponding to the first non-display area NDA1. Hereinafter, any repetitive detailed description of the same or like elements are those described above with reference to FIG. 5 will be omitted for convenience of description. In such an embodiment, the thin film transistor TFT, the organic light-emitting diode OLED, the thin-film encapsulation layer TFE, the touch unit TU, and the polarization plate 500 shown in FIG. 4 may be disposed or arranged on the substrate 100 of FIGS. 7 and 8. However, for convenience of illustration and description, such elements are omitted from FIGS. 7 and 8.

Referring to FIG. 7, an embodiment of the display device includes the substrate 100, the display element, the external light-absorbing layer 720, and the metal pattern 139. In such an embodiment, the substrate 100 includes the display area DA, the first non-display area NDA1 that neighbors the display area DA, the second non-display area NDA2, and the bending area BA arranged between the first non-display area NDA1 and the second non-display area NDA2. In such an embodiment, the display element may be disposed or arranged over a surface of the substrate 100 to correspond to the display area DA, the external light-absorbing layer 720 may be disposed or arranged on another surface of the substrate 100 opposite to the surface to correspond to the display area DA, and the metal pattern 139 may be disposed or arranged on the surface of the substrate 100 to correspond to the first non-display area NDA1.

The external light-absorbing layer 720 may be elements on arranged on the another surface of the substrate 100 to correspond to the display area DA. The external light-absorbing layer 720 may be elements on arranged in not only a portion of the display area DA in which the sensor module 780 is arranged but also an entire region of the display area DA. In such an embodiment, the embossed layer 750 shown in FIG. 5 arranged on the another surface of the substrate 100 with the resin layer 710 therebetween may be omitted.

The impact-alleviating layer 760 may be disposed or arranged on the another surface of the substrate 100 with the external light-absorbing layer 720 therebetween, may expose at least a portion of the another surface, and a third opening OP3 corresponding to the external light-absorbing layer 720 is defined through the impact-alleviating layer 760. The sensor module 780 may be disposed or arranged in the third opening OP3 over the another surface of the substrate 100 with the external light-absorbing layer 720 therebetween to correspond to the external light-absorbing layer 720.

The metal pattern 139 may be disposed or arranged on the surface of the substrate 100 corresponding to the first non-display area NDA1, and the bending protective layer 800 may be disposed or arranged on the surface of the substrate 100 corresponding to the bending area BA.

The driving circuit 150 may be disposed or arranged on the surface of the substrate 100 corresponding to the second non-display area NDA2, and the second protective layer 740 may be disposed or arranged on the another surface of the substrate 100 corresponding to the second non-display area NDA2. Referring to FIG. 8, while the bending area BA is bent around the bending axis BAX, the second protective layer 740 may be attached onto the another surface of the impact-alleviating layer 760 by the second adhesive 771.

Figure 9:
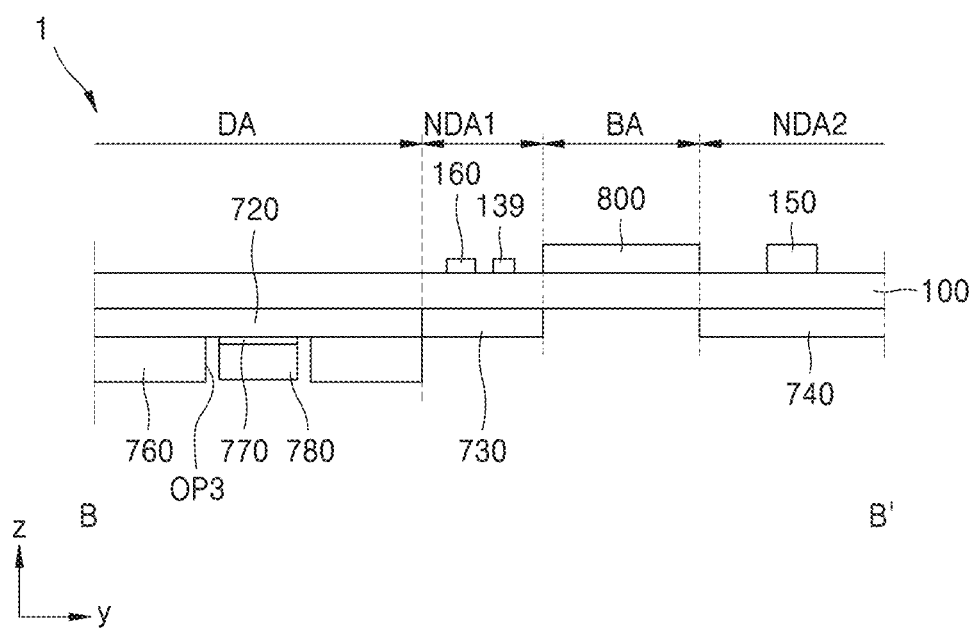
FIG. 9 is a cross-sectional view of a portion of the display device taken along line B-B' of FIG. 2.
Figure 10:
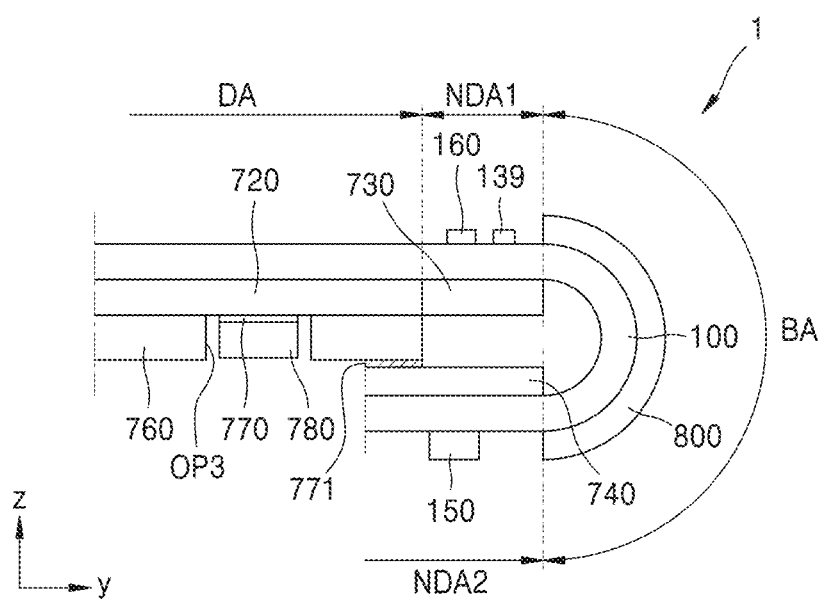
FIG. 10 is a cross-sectional view of a portion bent along a bending axis of the display device of FIG. 9.

FIG. 9 is a cross-sectional view of a portion of the display device taken along line B-B' of FIG. 2, and FIG. 10 is a cross-sectional view of a figure bent along the bending axis BAX of the display device of FIG. 9.

The display device shown in FIG. 9 is substantially the same as the display device shown in FIG. 7 except for elements on the another surface of the substrate 100 corresponding to the first non-display area NDA1. Hereinafter, any repetitive detailed description of the same or like elements as those described above with reference to FIGS. 5 and 7 will be omitted for convenience of description. In such an embodiment, the thin film transistor TFT, the organic light-emitting diode OLED, the thin-film encapsulation layer TFE, the touch unit TU, and the polarization plate 500 shown in FIG. 4 may be disposed or arranged on the substrate 100 of FIGS. 9 and 10. However, for convenience of illustration and description, such elements are omitted in FIGS. 9 and 10.

An embodiment of the display device may include the first protective layer 730 disposed or arranged on the another surface of the substrate 100 corresponding to the first non-display area NDA1. The first protective layer 730 may have the third transmittance, and the third transmittance may be in a range of about 50% to about 99%. The first protective layer 730 may be arranged on the another surface of the substrate 100 corresponding to the first non-display area NDA1 to protect the another surface of the substrate 100 and wirings (not shown) on the another surface of the substrate 100.

The external light-absorbing layer 720 may be disposed or arranged on the another surface of the substrate 100 corresponding to the display area DA. The external light-absorbing layer 720 may have the second transmittance less than the third transmittance, and the second transmittance may be in a range of about 3% to about 30%. The external light-absorbing layer 720 may be disposed or arranged on the another surface of the substrate 100 corresponding to the display area DA, may absorb external light, thereby preventing the sensor module 780 from being viewed, and may protect wirings (not shown) on the another surface of the substrate 100.

The second protective layer 740 may be disposed or arranged on the another surface of the substrate 100 corresponding to the second non-display area NDA2. The second protective layer 740 may have a fourth transmittance greater than the second transmittance, and the fourth transmittance may be in a range of about 50% to about 99%. The fourth transmittance of the second protective layer 740 may be the same as the third transmittance of the first protective layer 730. The second protective layer 740 may include a same material as that of the first protective layer 730.

In a conventional display device, a sensor module may be viewed due to external light reflection in a structure in which a film having a high transmittance is disposed under a substrate of the display device. However, in an embodiment of a display device according to the invention, a sensor module is effectively prevented from being viewed by locally lowering a transmittance of a portion in which the sensor module is arranged, with materials having different transmittances from each other, thereby reducing external light reflection, such that a product reliability is improved.

The invention should not be construed as being limited to the exemplary embodiments set forth herein. Rather, these exemplary embodiments are provided so that this disclosure will be thorough and complete and will fully convey the concept of the invention to those skilled in the art. For example, a method of manufacturing the display device is also within the scope of the disclosure.

According to an embodiment, a display device which prevents a sensor module from being viewed by locally lowering a transmittance of a portion in which the sensor module is arranged, with materials having different transmittances, thereby reducing external light reflection, and in which a product reliability is improved, may be provided. However, the scope of the disclosure is not limited by such features.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
a substrate including a display area, a first non-display area, a second non-display area, and a bending area, wherein the first non-display area neighbors the display area, and the bending area is disposed between the first non-display area and the second non-display area;
a display element disposed on a surface of the substrate to correspond to the display area;
a resin layer disposed on another surface of the substrate to correspond to the display area, wherein the resin layer exposes at least a portion of the another surface, and the another surface is opposite the surface;
an external light-absorbing layer disposed on a portion of the another surface exposed by the resin layer; and
a first protective layer disposed on the another surface of the substrate to correspond to the first non-display area.

2. The display device of claim 1, wherein
the resin layer has a first transmittance, and
the external light-absorbing layer has a second transmittance less than the first transmittance.

3. The display device of claim 2, wherein
the first transmittance is in a range of about 50% to about 99%, and
the second transmittance is in a range of about 3% to about 30%.

4. The display device of claim 1, further comprising:
an embossed layer disposed on the another surface of the substrate with the resin layer therebetween; and
an impact-alleviating layer disposed on the another surface of the substrate with the embossed layer therebetween.

5. The display device of claim 4, wherein
a first opening corresponding to the external light-absorbing layer is defined through the embossed layer, and
a second opening corresponding to the external light-absorbing layer is defined through the impact-alleviating layer.

6. The display device of claim 5, further comprising:
a sensor module disposed on the another surface of the substrate with the external light-absorbing layer therebetween, wherein the sensor module is disposed to correspond to the external light-absorbing layer; and
a first adhesive layer disposed between the external light-absorbing layer and the sensor module.

7. The display device of claim 6, wherein the sensor module is disposed on the another surface of the substrate to correspond to the first opening and the second opening.

8. The display device of claim 7, further comprising:
a metal pattern disposed on the surface of the substrate to correspond to the first non-display area, wherein the metal pattern allows the sensor module to be disposed at a location corresponding to the first opening and the second opening.

9. The display device of claim 1, wherein a composition of the external light-absorbing layer includes about 5 wt % to about 10 wt % of a binder polymer, about 1 wt % to about 3 wt % of a photoinitiator, about 1 wt % to about 5 wt % of a carbon black, about 1 wt % to about 5 wt % of a pigment dispersion agent, about 0.01 wt % to about 1 wt % of an additive, and about 70 wt % to about 85 wt % of a solvent.

10. The display device of claim 9, wherein the binder polymer has an average molecular weight in a range of about 3000 to about 10000 and is manufactured by radical-polymerizing a monomer.

11. The display device of claim 10, wherein
the composition of the external light-absorbing layer further includes about 5 wt % to about 10 wt % of a heat initiator, wherein the heat initiator includes 2, 4-dimethylvaleronitrile.

12. The display device of claim 9, wherein the photoinitiator includes at least one material selected from phenyl bis(2,4,6-trimethyl benzoyl) phosphine oxide, diphenyl(2,4, 6-trimethylbenzoyl) phosphine oxide, 2-Hydroxy-2-methyl-1-phenyl-1-propanone, and Bis(eta 5-2,4-cyclopentadien-1-yl) Bis(2,6-difluoro-3-(1H-pyrrol-1-yl)-phenyl) titanium.

13. The display device of claim 9, wherein the pigment dispersion agent includes at least one material selected from BYK-200, BYK-2001, BYK-161, BYK-163, BYK-160, PD-7000, DFKA-4330, and Disper-650.

14. The display device of claim 9, wherein the solvent includes at least one material selected from propylene glycol monomethyl ether acetate, ethyl ethoxy propionate, cyclohexanone, dipropylene glycol monomethyl ether acetate, n-butyl acetate, isobutyl acetate, ethylene glycol monomethyl acetate, ethylene glycol n-butyl acetate, diethylene glycol dimethyl ether, and dipropylene glycol monomethyl acetate.

15. A display device comprising:
a substrate including a display area, a first non-display area, a second non-display area, and a bending area, wherein the first non-display area neighbors the display area, and the bending area is disposed between the first non-display area and the second non-display area;
a display element disposed on a surface of the substrate to correspond to the display area;
an external light-absorbing layer disposed on another surface of the substrate to correspond to the display area, wherein the another surface is opposite the surface; and
a metal pattern disposed on the surface of the substrate to correspond to the first non-display area.

16. The display device of claim 15, further comprising:
a first protective layer disposed on the another surface of the substrate to correspond to the first non-display area.

17. The display device of claim 16, wherein
the first protective layer has a first transmittance, and
the external light-absorbing layer has a second transmittance less than the first transmittance.

18. The display device of claim 17, wherein
the first transmittance is in a range of about 50% to about 99%, and
the second transmittance is in a range of about 3% to about 30%.

19. The display device of claim 15, further comprising:
an impact-alleviating layer disposed on the another surface of the substrate with the external light-absorbing layer therebetween, wherein the impact-alleviating layer exposes at least a portion of the another surface, and an opening corresponding to the external light-absorbing layer is defined through the impact-alleviating layer; and a sensor module disposed on the another surface of the substrate with the external light-absorbing layer therebetween, wherein the sensor module is disposed to correspond to the external light-absorbing layer.

20. The display device of claim 19, wherein the sensor module is disposed on the another surface of the substrate to correspond to the opening.

* * * * *